United States Patent [19]
Furuno et al.

[11] Patent Number: 5,917,237
[45] Date of Patent: Jun. 29, 1999

[54] SEMICONDUCTOR INTEGRATED CIRCUIT DEVICE AND LEAD FRAME THEREFOR

[75] Inventors: Satoshi Furuno; Kenji Otani; Koichi Inoue, all of Kyoto; Koichi Yamasaki, Chiba, all of Japan

[73] Assignee: Rohm Co., Ltd., Kyoto, Japan

[21] Appl. No.: 08/864,085

[22] Filed: May 28, 1997

Related U.S. Application Data

[62] Division of application No. 08/430,377, Apr. 28, 1995, Pat. No. 5,686,362.

[30] Foreign Application Priority Data

Apr. 28, 1994 [JP] Japan .................................. 6-090964

[51] Int. Cl.⁶ .................. H01L 23/48; H01L 23/495; H01L 23/04
[52] U.S. Cl. .................. 257/676; 257/666; 257/692; 257/797; 257/696; 257/698
[58] Field of Search .................... 257/666, 692, 257/797, 676, 668, 696, 698, 675, 690, 693, 707, 711

[56] References Cited

U.S. PATENT DOCUMENTS

| | | | |
|---|---|---|---|
| 5,175,610 | 12/1992 | Kobayashi | 257/676 |
| 5,214,307 | 5/1993 | Davis | 257/666 |
| 5,397,915 | 3/1995 | Nose | 257/666 |
| 5,578,871 | 11/1996 | Fierkens | 257/676 |

FOREIGN PATENT DOCUMENTS

| | | | |
|---|---|---|---|
| 58-207645 | 12/1983 | Japan | 257/676 |
| 59-94853 | 5/1984 | Japan | 257/676 |
| 2-84758 | 3/1990 | Japan | 257/676 |
| 4-309257 | 10/1992 | Japan | 257/666 |
| 6-61394 | 3/1994 | Japan | 257/676 |
| 6-132443 | 5/1994 | Japan | 257/676 |

*Primary Examiner*—Alexander Oscar Williams
*Attorney, Agent, or Firm*—Baker & Botts, L.L.P.

[57] ABSTRACT

A single semiconductor chip containing a control portion and a power portion including a power element associated with the control portion and a concave portion formed between the control portion and the power portion is mounted on a die pad so as to separate the control portion and the power portion. The die pad has a convex portion which is received in the concave portion and the semiconductor chip is divided to separate the control portion and the power portion by applying pressure to the chip or by applying laser beams, and the separated semiconductor chip portions are simultaneously bonded to the die pad.

5 Claims, 2 Drawing Sheets

500
SEMICONDUCTOR INTEGRATED CIRCUIT DEVICE AND LEAD FRAME THEREFOR

This is a divisional of copending application Ser. No. 0/08/430,377 filed on Apr. 28, 1995 now U.S. Pat. No. 5,686,362.

BACKGROUND OF THE INVENTION

This invention relates to methods of manufacturing semiconductor integrated circuit (IC) devices and to lead frames used in such manufacturing methods and, more particularly, is directed to a method of manufacturing a semiconductor IC device, such as a monolithic IC, a hybrid IC or the like, and to a lead frame used in such a manufacturing method.

In semiconductor integrated circuit devices in which a control portion and a power portion having a power element associated with the control portion are fabricated on a single semiconductor chip, it is known that the heat generated by the power portion affects the electrical characteristics of the control portion, interfering with the control relationship between the control portion and the power portion.

FIG. 3 shows a conventional IC die structure arranged to solve that problem. In FIG. 3, a semiconductor chip Ta having a control portion and a separate semiconductor chip Tb including a power portion are mounted in spaced relation on a die pad D of a lead frame. As a result, heat generated by the power portion Tb is not conducted directly to the control portion Ta but is conducted to the control portion Ta only indirectly through the die pad D. Since the semiconductor chip Ta and the semiconductor chip Tb are thus separated from each other and the heat generated by the power portion Tb is not conducted directly to the control portion Ta as described above, the control portion Ta is not affected by the heat generated in the power portion Tb.

In this arrangement, however, die bonding has to be carried out separately for each of the chips Ta and Tb. Consequently, if a semiconductor IC device is made with a plurality of semiconductor chips, for example, two semiconductor chips as in the conventional example of FIG. 3, then the die bonding step has to be carried out as many times for each die pad as the number of the semiconductor chips mounted on the die pad, i.e., twice as in the conventional example of FIG. 3. Therefore, the time required for die bonding is increased and the cost of die bonding is increased correspondingly.

SUMMARY OF THE INVENTION

Accordingly, it is an object of the present invention to provide a method of manufacturing a semiconductor integrated circuit device, and a lead frame therefor, which overcome the disadvantages of the prior art.

Another object of the invention is to provide a method of manufacturing a semiconductor integrated circuit device containing a plurality of semiconductor chips which can be manufactured using a single die bonding step and a lead frame used in that manufacturing method.

These and other objects of the invention are attained by integrally fabricating a semiconductor chip containing a first semiconductor chip portion and a second semiconductor chip portion which has a power element associated with the first semiconductor chip portion and forming a concave portion in the clip between the first and second semiconductor chip portions;

forming a convex portion having a height which is larger than a depth of the concave portion on a semiconductor chip mounting member on which the first and second semiconductor chip portions are to be mounted; and separating the first and second semiconductor chip portions on the mounting member by pressing the concave portion against the convex portion and bonding the first and second semiconductor chip portions on the semiconductor chip mounting member at the same time.

A second method of manufacturing a semiconductor integrated circuit device according to the present invention includes integrally fabricating a semiconductor chip containing a first semiconductor chip portion and a second semiconductor chip portion which has a power element associated with the first semiconductor chip portion and forming a concave portion in the chip between the first and second semiconductor chip portions;

forming a convex portion which is to be fixed to the concave portion in the chip on a semiconductor chip mounting member on which the first and second semiconductor chip portions are mounted; and bonding the first and second semiconductor chip portions to the semiconductor chip mounting portion so that the convex mounting member portion is received in the concave chip portion and separating the first and second semiconductor chip portions by laser beams.

A lead frame for mounting a semiconductor chip containing a first semiconductor chip portion and a second semiconductor chip portion having a power element associated with the first semiconductor chip portion which are fabricated integrally and having a concave portion formed between the first and second semiconductor chip portions includes a convex portion to be received in the concave chip between the first and second semiconductor chip portions.

In the first method of manufacturing a semiconductor integrated circuit device, only the convex mounting member portion and the concave chip portion are initially in contact with each other since the height of the convex portion of the mounting member is greater than the depth of the concave portion formed between the first and second semiconductor chip portions. Then, when the first and second semiconductor chip portions are separated from each other by pressing the chip against the mounting member, the first and second semiconductor chip portions are bonded to the mounting member on opposite sides of the convex portion. As a result, the two semiconductor chip portions are separately mounted on the semiconductor chip mounting member by die bonding.

According to the second method of manufacturing a semiconductor integrated circuit device, the first and second semiconductor chip portions are mounted on the semiconductor chip mounting member with the convex portion of the mounting member received in the concave chip portion between the first and second semiconductor chip portions. Then, when the first and second semiconductor chip portions are separated along the convex mounting member portion and the concave chip portion by laser beams, a space is cut in the concave portion between the first and second semiconductor chip portions with the result that the two semiconductor chips are separately affixed to the semiconductor chip mounting member by die bonding.

Because of the arrangement of the lead frame as described above, when the convex portion of the lead frame is received in the concave portion of the semiconductor chip which is located between the first and second semiconductor chip portions, the semiconductor chip portions can be mounted on the lead frame with high accuracy of alignment.

BRIEF DESCRIPTION OF THE DRAWINGS

Further objects and advantages of the invention will be apparent from a reading of the following description in conjunction with the accompanying drawings, in which.

DETAILED DESCRIPTION OF PREFERRED EMBODIMENTS

Figure 1A:
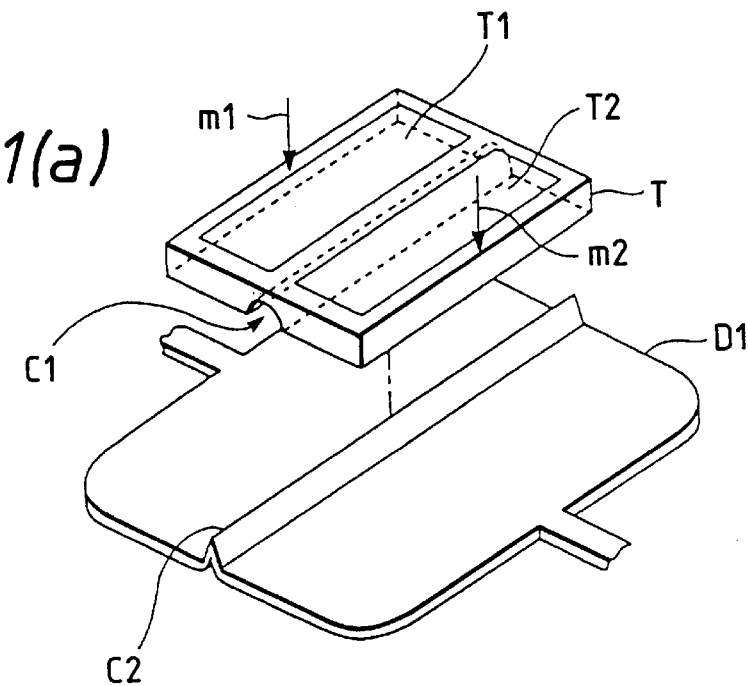
FIGS. 1(a) and 1(b) are perspective views showing a first representative embodiment of a die bonding process according the present invention.

Typical methods of manufacturing a semiconductor integrated circuit device and a lead frame therefor according to the present invention are described hereinafter with reference to the drawings. Elements and parts corresponding to those of the conventional example described above with reference to FIG. 3 are marked with the same reference characters and will not be described in detail.

Figure 1B:
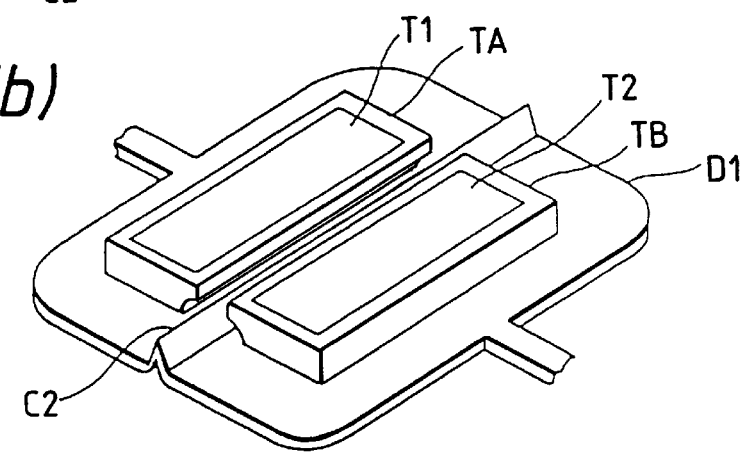

In the first representative embodiment of the invention shown in FIGS. 1(a) and 1(b), a control portion T1 and a power portion T2 which has a power element associated with the control portion T1 are integrally fabricated on a single semiconductor chip T by conventional techniques including impurity diffusion and the like. In the chip T, the control portion T1 and the power portion T2 are electrically isolated from each other and are made in hybrid form on the surface of the single semiconductor chip in such a way that they are electrically independent. The semiconductor chip T has a concave groove C1 formed in its lower surface between the control portion T1 and the power portion T2.

In addition, a die pad D1 for a lead frame is provided for mounting the semiconductor chip T. The die pad D1 includes a convex portion C2 extending in a straight line and having a height which is greater than the depth of the concave portion C1. Because the height of the convex portion C2 is greater than the depth of the concave portion C1, when these two components are moved together only the concave portion C1 and the convex portion C2 can come into contact with each other and the lower surface of the semiconductor chip T does not engage the upper surface of the die pad D1. Thus, when the convex portion C2 is received in the concave portion C1 between the control portion T1 and the power portion T2 during the chip mounting step, the semiconductor chip T can be attached to the die pad D1 with high accuracy of alignment.

To mount the semiconductor chip portions on the die pad D1, a die bonding adhesive is coated on the die pad and the concave portion C1 and the convex portion C2 are brought in contact with each other. With the concave portion C1 and the convex portion C2 in contact with each other, the semiconductor chip T is pressed downwardly toward the die pad D1 as shown by the arrows m1 and m2 in FIG. 1(a), so that pressure is applied by the convex portion C2 to the concave portion C1. As a result, the semiconductor chip T is split along the concave portion C1 and the two parts are pressed against the die pad on opposite sides of the convex portion C2, being separated by the inverted V-shaped sides of the convex portion C2. Consequently, the semiconductor chip T is divided to provide the semiconductor chip portion TA having the control portion T1 which is separated from the semiconductor chip portion TB containing the power portion T2 as shown in FIG. 1(b).

The semiconductor chip portion TA and the semiconductor chip portion TB that are produced when the semiconductor chip T is divided move downwardly along the opposite side surfaces of the convex portion C2 as a result of the above-mentioned pressure and are spaced from each other on opposite sides of the convex portion C2, and thus bonded to the die pad D1 as shown in FIG. 1(b). As a result, the two semiconductor chips TA and TB are separately attached by die bonding to the die pad D1 with a space between them.

The convex portion C2 is preferably narrow so as to enable the separate edges of the semiconductor chip portions TA and TB to move smoothly along the side surfaces of the convex portion C2 during the pressing step in which the semiconductor chip T is divided into the semiconductor chips TA and TB and the two semiconductor chips TA and TB are then attached to the die pad by die bonding. Moreover, while the concave portion C1 is shaped as a groove and the convex portion C2 is shaped as a straight line and fits into the convex portion C1 as described above, if the convex portion C2 is made longer than the concave portion C1 and a plurality of chips with concave portions are positioned in a straight line on the convex portion, it is possible to similarly attach a plurality of semiconductor chips to the die pad D1 by die bonding.

Figure 2A:
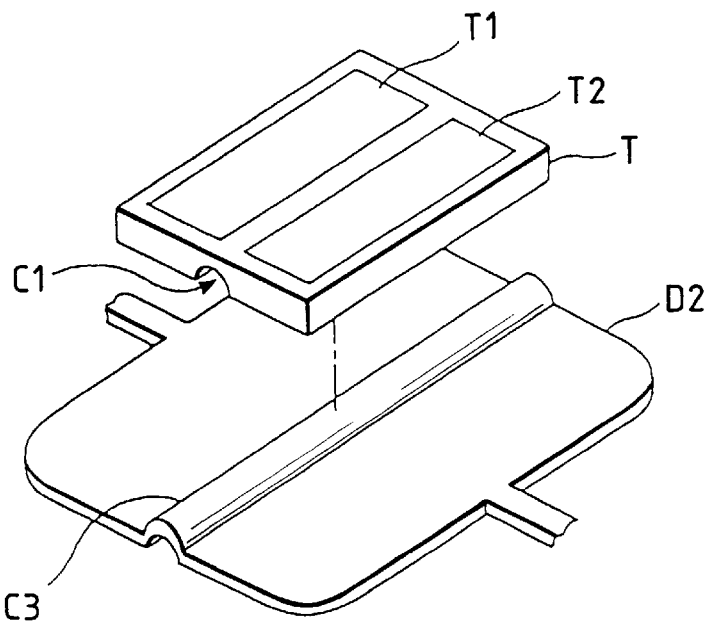
FIGS. 2(a)–2(c) are perspective views showing a second representative embodiment of a die bonding process according to the present invention.
Figure 2B:
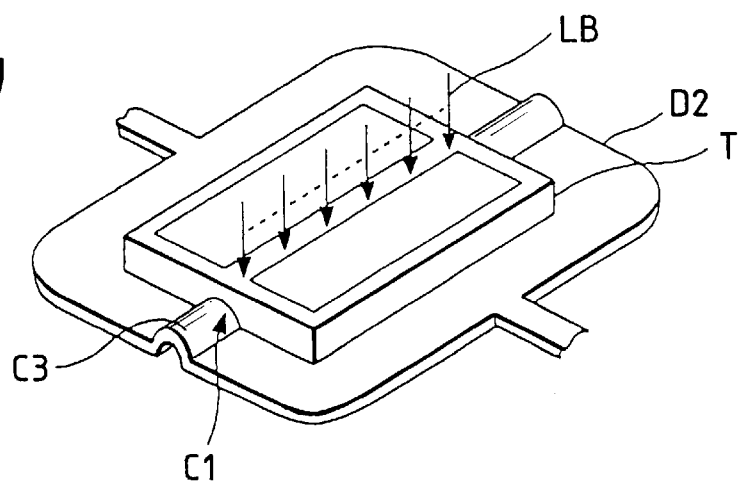
Figure 2C:
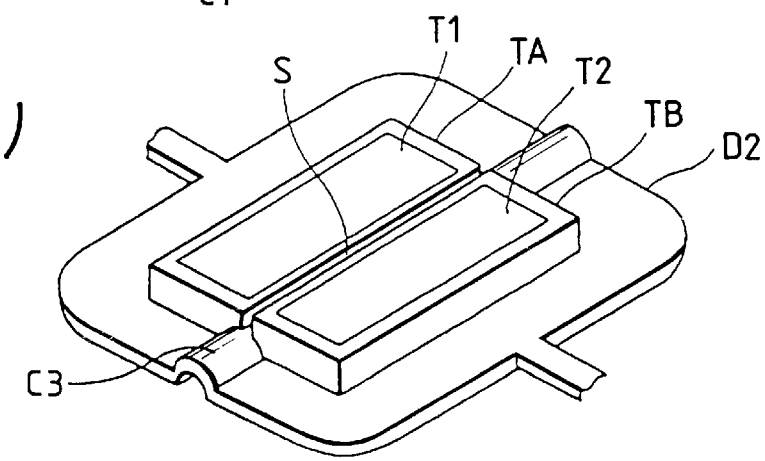

FIGS. 2(a)–2(c) show a die bonding process used in a manufacturing method according to the second representative embodiment of the present invention. As shown in FIG. 2(a), the semiconductor chip T used in the second embodiment is the same as that of the first embodiment. A die pad D2 of a lead frame for mounting the semiconductor chip T is the same in structure as the die pad D1 of the first embodiment except for the shape of a convex portion C3. This convex portion C3 has the same shape as and fits into the concave portion C1 of the semiconductor chip 7.

While the convex portion C3 fits completely and closely into the concave portion C1, the height and width of the convex portion C3 are preferably selected to be very slightly smaller than those of the concave portion C1 so that the convex portion C3 can fit easily into the concave portion C1. When the concave portion C1 and the convex portion C3 are in contact with each other so that the convex portion C3 is received in the concave portion C1 between the control portion T1 and the power portion T2, the semiconductor chip T can be attached to the die pad D1 with high alignment accuracy. The function of the convex portion C3 according to the second embodiment is only to provide this alignment so as to accurately position the semiconductor chip T on the die pad D1 which is different from the function of the convex portion C2 according to the first embodiment.

As shown in FIG. 2(b), the semiconductor chip T is mounted on and bonded to the die pad D2, to which a die bonding adhesive has been applied, in such a way that the convex portion C3 is received in the concave portion C1. Then, a laser cutter apparatus (not shown) is used to direct laser beams LB on the fixed upper surface of the concave portion C1 in which the convex portion C3 is received. As a result, the chip portions that are impinged by the laser beams LB disintegrate to form a space S between the semiconductor chip portions TA and TB above the convex portion C3 so that the semiconductor chip T is divided. This separates the chip portion TA in which the power portion T1 is fabricated from the semiconductor chip portion TB in which the control portion T2 is fabricated as shown in FIG. 2(c). Consequently, the two semiconductor chips TA and TB are separately attached to the die pad D2 by die bonding.

If the depth of the concave portion C1 is reduced, a deeper cut must be made in the semiconductor chip T by the laser beams, which necessarily requires a high intensity laser output. Accordingly, if the size and shape of the concave portion C1 are selected properly, it is possible to reduce the laser cutting time and to increase the efficiency of the laser radiation.

Figure 3:
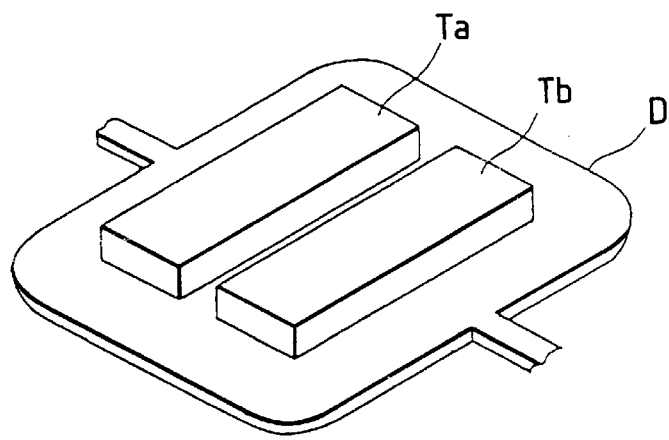
FIG. 3 is a perspective view showing a lead frame having integrated circuit components according to a conventional arrangement.

According to the first and second embodiments of the present invention as described above, it is possible to provide a bonded die structure containing a plurality of semiconductor chips by a single die bonding and the cost and time required for the die bonding are reduced as compared with the conventional example having two semiconductor chips as shown in FIG. 3. In addition, it is possible to obtain the advantage of the two-chip die bonded structure shown in FIG. 3 in which the control portion Ta is not affected by heat generated from the power portion Tb. This is accomplished by dividing the semiconductor chip portion TA having the control portion T1 from the semiconductor chip portion TB having the power portion T2 by splitting the convex portion C2 or by the radiation of laser beams LB. Then the heat generated by the power portion T2 does not affect the electrical characteristic of the control portion T1 so as interfere with the combined operational characteristic of the control portion T1 and the power portion T2. The manufacturing methods according to the present invention can also be applied to the manufacture of a semiconductor integrated circuit device, such as a high frequency IC or the like, having a plurality of semiconductor chips with different functions that to prevent a control portion from being affected not only by heat generated from a power portion but also from an electrical standpoint.

Since one semiconductor chip T is divided to provide only one control portion T1 and one power portion T2 according to the above described embodiment of the invention, only one concave portion C1 and one convex portion C2 or C3 are provided. The number of pairs of such portions, however, is not limited to one and may be two or greater. Specifically, the number of separated semiconductor chip portions produced in accordance with the connection is not limited to two. If a plurality of concave portions C1 are formed in a semiconductor chip in which a plurality of control portions T1 and a plurality of power portions T2 are formed in a hybrid manner, and corresponding convex portions are formed on the die pad, then it is possible to divide a single semiconductor chip into a large number of semiconductor chips.

Although the semiconductor chip portions are attached to the die pad of the lead frame by die bonding in order to improve the electrical characteristics of a monolithic IC having a single function by isolating the two semiconductor chips so that one semiconductor chip portion can be protected from heat generated by the other semiconductor chip portion according to the described embodiments of the invention, when the present invention is applied to the manufacture of a hybrid IC, it is possible to use a substrate on which a number of convex portions C2 or C3 are fabricated in the semiconductor chip mounting member.

While the convex portions C2 and C3 are formed by pressing a flat-shaped die pad from the rear surface as described above, the present invention is not limited thereto and the convex portions C2 and C3 may also be formed, for example, by molding when the die pad is formed. Also, while the rear surfaces of the convex portions C2 and C3 are concave as described above, the present invention is not limited thereto and the rear surfaces of the convex portion C2 and C3 may have a planar shape.

As described above, in the method of manufacturing the semiconductor integrated circuit device according to the first embodiment, since the height of the convex portion formed on the semiconductor chip mounting member is greater than the depth of the concave portion formed between the first and second semiconductor chip portions, the first and second semiconductor chip portions are divided by pressing the chip against the convex portion and the first and second semiconductor chip portions are simultaneously bonded to the semiconductor chip mounting member. Thus, it is possible to manufacture semiconductor integrated circuit devices having a plurality of semiconductor chips by using a single die bonding step.

In the method of manufacturing the semiconductor integrated circuit device according to the second embodiment, since the first and second semiconductor chip portions are simultaneously bonded to the semiconductor chip mounting member so that the convex portion formed on the semiconductor chip mounting portion is received in the concave portion defined between the first and second semiconductor chip portions, and laser beams are applied to the combined convex and concave portions to divide the first and second semiconductor chip portions, it is possible to manufacture a semiconductor integrated circuit device having a plurality of semiconductor chips using a single die bonding step.

Because the semiconductor integrated circuit device having a plurality of semiconductor chips can be manufactured using one die bonding step as described above, the time required for die bonding can be reduced and the cost of the die bonding operation can be reduced accordingly. In addition, it is possible to provide the advantages of the conventional two-chip die bonded structure in which the control portion is not affected by heat generated by the power portion. This is accomplished by separating the semiconductor chip portion having the control portion from the semiconductor chip portion having the power portion by using the convex die pad portion or by laser beam radiation. This prevents the heat generated by the power portion from affecting the electrical characteristics of the control portion and interfering with the combined operational relation of the control portion and the power portion.

In the lead frame according to the present invention, since the convex portion which is interposed between the first and second semiconductor chip portions is received in the concave portion of the semiconductor chip to control positioning and separation of the chip portions, it is possible to manufacture a semiconductor integrated circuit device having a plurality of semiconductor chips using a single die bonding step.

Although the invention has been described herein with reference to specific embodiments, many modifications and variations therein will readily occur to those skilled in the art. Accordingly, all such variations and modifications are included within the intended scope of the invention.

What is claimed is:

1. A lead frame for mounting a semiconductor chip containing a first semiconductor chip portion and a second semiconductor chip portion having a power element associated with said first semiconductor chip portion which are integrally fabricated and a concave portion formed between said first and second semiconductor chip portions comprising a lead frame having a convex portion to be received in the concave portion of the semiconductor chip between the first and second semiconductor chip portions.

2. Lead frames for mounting a semiconductor chip containing first semiconductor chip portions and second semiconductor chip portions having power elements associated with said first semiconductor chip portions which are integrally fabricated and a plural of concave portions formed between said first and second semiconductor chip portions comprising lead frames having a plural of convex portions to be received in the concave portions of the semiconductor chips between the first and second semiconductor chip portions.

3. A semiconductor device comprising:

a die pad having an elongated convex surface portion;

a first semiconductor chip portion mounted on the die pad on one side of the elongated convex surface portion; and a second semiconductor chip portion mounted on the die pad on the opposite side of the elongated convex surface portion.

4. A semiconductor device according to claim 3 wherein the first semiconductor chip portion includes a control portion of the semiconductor device and the second semiconductor chip portion includes a power portion of the semiconductor device.

5. A semiconductor device according to claim 3 wherein the first and second semiconductor chip portions each include a parts of a concave groove extending along facing edges of the chip portions adjacent to the convex surface portion of the die pad, the facing edges having mating surfaces formed by separation of the chip portions from an integral chip along those edges.

* * * * *

UNITED STATES PATENT AND TRADEMARK OFFICE
CERTIFICATE OF CORRECTION

PATENT NO. : 5,917,237

DATED : June 29, 1999

INVENTOR(S) : Satoshi Furuno et al.

It is certified that error appears in the above-identified patent and that said Letters Patent is hereby corrected as shown below:

Column 7, Claim 2, lines 8 and 10, "plural" should read --plurality--.

Column 8, Claim 5, line 12, "parts" should read --part--.

Signed and Sealed this

Twelfth Day of September, 2000

Attest:

Q. TODD DICKINSON

Attesting Officer     Director of Patents and Trademarks